(12) United States Patent
Bergstrom

(10) Patent No.: US 10,974,273 B2
(45) Date of Patent: Apr. 13, 2021

(54) METHOD AND APPARATUS FOR JETTING OF VISCOUS MEDIUM USING IMPACTING DEVICE

(71) Applicant: Mycronic AB, Taby (SE)

(72) Inventor: Johan Bergstrom, Bromma (SE)

(73) Assignee: Mycronic AB, Taby (SE)

( * ) Notice: Subject to any disclaimer, the term of this patent is extended or adjusted under 35 U.S.C. 154(b) by 74 days.

(21) Appl. No.: 16/340,201

(22) PCT Filed: Oct. 11, 2017

(86) PCT No.: PCT/EP2017/075974
§ 371 (c)(1),
(2) Date: Apr. 8, 2019

(87) PCT Pub. No.: WO2018/073078
PCT Pub. Date: Apr. 26, 2018

(65) Prior Publication Data
US 2020/0038902 A1  Feb. 6, 2020

(30) Foreign Application Priority Data

Oct. 18, 2016 (SE) .................................. 1630252-3

(51) Int. Cl.
*B05C 5/02* (2006.01)
*B05C 11/10* (2006.01)
(Continued)

(52) U.S. Cl.
CPC .......... *B05C 5/0225* (2013.01); *B05B 1/3026* (2013.01); *B05B 1/3046* (2013.01);
(Continued)

(58) Field of Classification Search
CPC . B05B 1/3026; B05B 1/3046; B05B 17/0607; B05C 5/0225; B05C 11/1034; B23K 2101/42; B23K 3/0638; B41J 2/14
(Continued)

(56) References Cited

U.S. PATENT DOCUMENTS

2004/0084549 A1   5/2004  Maruyama et al.
2004/0217193 A1*  11/2004 Holm ................... B23K 3/0607
                                                     239/1
(Continued)

FOREIGN PATENT DOCUMENTS

JP        H10128217 A    5/1998

OTHER PUBLICATIONS

International Search Report (PCT/ISA/210) for PCT Interntional Application No. PCT/EP2017/075974 dated Dec. 14, 2019.

*Primary Examiner* — Steven J Ganey
(74) *Attorney, Agent, or Firm* — Harness, Dickey & Pierce, P.L.C.

(57) ABSTRACT

An ejector for jetting a viscous medium onto a substrate is disclosed. The ejector comprises a jetting chamber adapted to accommodate the viscous medium, a nozzle communicatively connected to the chamber, and an impacting device adapted to impact a volume of the viscous medium in the chamber such that viscous medium is jetted through the nozzle towards the substrate. The ejector may further comprise a rotating mechanism adapted to rotate the impacting device around a length axis of the impacting device such that shearing is induced in the viscous medium to be jetted. A corresponding system and method is also disclosed.

20 Claims, 6 Drawing Sheets

(51) Int. Cl.
*B05B 1/30* (2006.01)
*B05B 17/06* (2006.01)
*B23K 101/42* (2006.01)
*B23K 3/06* (2006.01)
*B41J 2/14* (2006.01)

(52) U.S. Cl.
CPC ...... B05B 17/0607 (2013.01); B05C 11/1034 (2013.01); *B23K 3/0638* (2013.01); *B23K 2101/42* (2018.08); *B41J 2/14* (2013.01)

(58) Field of Classification Search
USPC ... 239/1, 4, 102.1, 102.2, 581.1, 585.2, 583, 239/584
See application file for complete search history.

(56) References Cited

U.S. PATENT DOCUMENTS

2015/0274371 A1   10/2015   Fliess et al.
2016/0031030 A1*  2/2016    Bergstrom ............ H05K 3/125
                                                    118/697

\* cited by examiner

METHOD AND APPARATUS FOR JETTING OF VISCOUS MEDIUM USING IMPACTING DEVICE

CROSS-REFERENCE TO RELATED APPLICATIONS

This application is a national phase under 35 U.S.C. § 371 of PCT International Application No. PCT/EP2017/075974 which has an International filing date of Oct. 11, 2017, which claims priority to Swedish Patent Application No. 1630252-3, filed Oct. 18, 2016, the entire contents of each of which are hereby incorporated by reference.

TECHNICAL FIELD

The invention disclosed herein relates to jetting of viscous medium onto a substrate. More precisely, it relates to an ejector and a method utilizing an impacting device for inducing shearing in the viscous medium to be jetted.

BACKGROUND

Ejectors and methods are known in the art for jetting droplets of viscous medium or fluid, such as e.g. solder paste or adhesive, onto a substrate such as a printed wiring board (PWB), thus forming deposits on the substrate prior mounting components thereon. Such an ejector generally comprises a chamber for accommodating a volume of the viscous medium prior to the jetting thereof, a jetting nozzle communicating with the chamber, and an impacting device for impacting and jetting the viscous medium from the chamber through the nozzle in the form of droplets. Further, a feeding mechanism may be utilised to feed the medium to the chamber.

High production accuracy and reliability are factors of interest when manufacturing e.g. printed circuit board (PCB) assemblies. In particular, the reliability, such as e.g. the accuracy and repeatability of the jetting process is of interest due to its effects on the performance and the quality of the final product, such as e.g. the PCB assembly. Too small volumes of deposited medium may e.g. lead to dry joints or loosening components, whereas too large volumes of deposited medium may result in short-circuiting caused by e.g. solder balls, or defective contacts due to contamination of adhesive or underfill.

To increase process reliability and performance, an improved control of the application of the deposited medium is desirable so as to reduce the risk for unintentional short-cuts, contamination or erroneous volumes.

SUMMARY

An object of the present inventive concept is accordingly to provide an improved and more reliable application of jetted droplets onto a substrate. Additional and alternative objectives may be understood from the following.

According to an aspect of the present inventive concept there is provided an ejector for jetting a viscous medium onto a substrate. The ejector comprises a jetting chamber adapted to accommodate the viscous medium, a nozzle communicatively connected to the chamber, and an impacting device adapted to impact a volume of the viscous medium in the chamber such that viscous medium is jetted through the nozzle towards the substrate. The ejector is further configured so that, in a first step, the impacting device is adapted to move up and down in a sequence of vertical reciprocal movements such that shearing is induced in the viscous medium to be jetted.

According to certain aspects of the technology disclosed, the impacting device may be configured to move in a first sequence of vertical movements such that shearing is induced in the viscous medium to be jetted without, or without substantially, any viscous medium being jetted through the nozzle, followed by a second separate movement of the impacting device aimed at impacting a volume of the viscous medium in the chamber such that viscous medium is jetted through the nozzle towards the substrate.

According to an aspect of the present inventive concept there is provided an ejector for jetting a viscous medium onto a substrate. The ejector comprises a jetting chamber adapted to accommodate the viscous medium, a nozzle communicatively connected to the chamber, and an impacting device adapted to impact a volume of the viscous medium in the chamber such that viscous medium is jetted through the nozzle towards the substrate. The ejector further comprises a rotating mechanism that is adapted to rotate the impacting device around a length axis of the impacting device, wherein the impacting device is configured to rotate such that shearing is induced in the viscous medium to be jetted.

The ejector may be used with a viscous medium that exhibits shear thinning (or shear thickening) properties. By at least one of performing a sequence of vertical reciprocal movements and rotating the impacting device and thus subject the viscous medium to deformation or shear forces, the viscosity of the viscous medium may be affected as the viscous medium passes the rotating impacting device towards the jetting chamber. The ejector hence allows for the viscosity of the viscous medium to be varied or controlled prior to the impact by the impacting device. In case the ejector is used with a shear shinning medium, the viscosity of the viscous medium may be reduced in response to the shearing so as to facilitate feeding and pumping of the viscous medium in the ejector and reduce the risk of blocking or clogging of the nozzle. In case the ejector is used with a shear thickening medium, the viscosity of the viscous medium may be increased in response to the vertical reciprocal movements and/or rotation of the impacting device so as to promote a more distinct break-off point for the filament that is formed during droplet formation and allow the droplet to be more accurately positioned on the substrate. By shear thinning is hereby meant a reduction in viscosity in response to deformation, whereas shear thickening should be understood an increase in viscosity caused by deformation or shearing.

The viscosity is thus an important factor for the internal fluid dynamics of the ejector, and affects in particular the pumping and ejection of the viscous medium. The viscosity may however also be an important parameter for underfill material, which may be used in connection with e.g. flip chip and ball grid array components. The underfill material may formed by deposits of viscous medium to provide a stronger mechanical connection, provide a heat bridge, and to distribute thermal expansion mismatch between the component and the substrate. If the viscosity of the deposited underfill material is too low, the deposit may tend to form a flat surface that may trap air bubbles when the component is being attached. If the viscosity is too high, the force needed to allow the bump of the component to penetrate through the material may be outside the function range of the mounting machine. The ejector according to the present inventive concept is thus advantageous in that it provides an improved control of the viscosity of the viscous medium as it is being applied to the substrate and forms e.g. the underfill deposit.

The vertical reciprocal movements of the impacting device and/or rotating mechanism may also induce shear in the viscous medium already present in the jetting chamber. This is of particular interest at the beginning or start-up of a jetting sequence, as the viscous medium already present in the jetting chamber otherwise tend to have an initial viscosity that differs from the viscosity of the viscous medium that is being feed to the jetting chamber during the jetting sequence. By subjecting the viscous medium in the jetting chamber to shearing before the jetting sequence is started, that is, before the first droplets are jetted onto the substrate, the viscous medium may be given a viscosity that is closer a steady state viscosity of a continuous jetting sequence.

According to an embodiment, the ejector may comprise a rotating mechanism adapted to rotate the impacting part around a length axis of the impacting device, wherein the impacting part is configured to rotate such that shearing is induced in the viscous medium to be jetted. This is a particular advantage when the ejector is used with a viscous medium that exhibits shear thinning (or shear thickening) properties. By rotating the impacting device and thus subject the viscous medium to shearing, the viscosity of the viscous medium may be affected as the viscous medium passes the rotating impacting device towards the jetting chamber. The ejector hence allows for the viscosity of the viscous medium to be varied or controlled prior to the impact by the impacting device. In case the ejector is used with a shear shinning medium, the viscosity of the viscous medium may be reduced in response to the shearing so as to facilitate feeding and pumping of the viscous medium in the ejector and reduce the risk of blocking or clogging of the nozzle. In case the ejector is used with a shear thickening medium, the viscosity of the viscous medium may be increased in response to the rotation of the impacting device so as to promote a more distinct break-off point for the filament that is formed during droplet formation and allow the droplet to be more accurately positioned on the substrate. The rotating mechanism may also induce shear in the viscous medium already present in the jetting chamber. This is of particular interest at the beginning or start-up of a jetting sequence, as the viscous medium already present in the jetting chamber otherwise tend to have a viscosity that differs from the viscosity of the viscous medium that is being feed to the jetting chamber during the jetting sequence. By subjecting the viscous medium in the jetting chamber to shearing before the jetting sequence is started, that is, before the first droplets are jetted onto the substrate, the viscous medium may be given an initial viscosity that is closer a steady state viscosity of a continuous jetting sequence.

The vertical reciprocal movements and/or rotation of the impacting device could further be adjusted to compensate for variations in viscosity between different types or batches of viscous media, thereby allowing for a broader variety of viscous media types to be jetted by the ejector.

In the context of the present application, it is to be noted that the term "viscous medium" should be understood as a medium comprising e.g., solder paste, solder flux, adhesive, conductive adhesive, or any other kind of medium or fluid used for fastening components on a substrate, conductive ink, resistive paste, or the like.

For at least some solder paste applications, the solder paste may include between about 40% and about 60%, inclusive, by volume of solder balls and the rest of the volume is solder flux. The solder balls are typically about 20 microns in diameter, or between about 10 and about 30 microns, inclusive, in diameter.

In at least some solder paste applications, the volume percentage of solder balls of average size may be in the range of between about 5% and about 40%, inclusive, of the entire volume of solid phase material within the solder paste. In other applications, the average diameter of the first fraction of solder balls may be within the range of between about 2 and about 5 microns, inclusive, while the average diameter of a second fraction of solder balls may be between about 10 and about 30 microns, inclusive.

The term "jetted droplet", or "shot" should be understood as the volume of the viscous medium that is forced through the jetting nozzle and moving towards the substrate in response to an impact of the impacting device. It will however be appreciated that a plurality of droplets may be expelled from the nozzle in response to a single stroke of the impacting device.

By the term "jetting" is meant a non-contact deposition process that utilizes a jet to form and shoot droplets of a viscous medium from a jetting nozzle onto a substrate, as compared to a contact dispensing process, such as "fluid wetting". In contrast to a dispenser and dispensing process where a needle in combination with, for contact dispensing, the gravitation force and adhesion force with respect to the surface is used to dispense viscous medium on a surface, an ejector or jetting head assembly for jetting or shooting viscous medium should be interpreted as an apparatus including for example a piezoelectric actuator and a plunger for rapidly building up pressure in the jetting chamber by the rapid movement (e.g., rapid controlled mechanical movement) of the impacting device (e.g., the rapid movement of a plunger) over a period of time that may be longer than about 1 microsecond, but less than about 50 microseconds, thereby providing a deformation of the fluid in the chamber that forces droplets of viscous medium through a jetting nozzle. In one implementation, an ejection control unit applies a drive voltage intermittently to a piezoelectric actuator, thereby causing an intermittent extension thereof, and a reciprocating movement of a plunger with respect to the assembly housing of the ejector or jetting assembly head.

The jetting of viscous medium may be performed in a sequence of shots while the jetting nozzle is in motion without stopping at each location on the workpiece or substrate where viscous medium is to be deposited.

A volume of each individual droplet to be jetted onto the workpiece may be between about 0.1 nanolitres and about 30 nanolitres. A dot diameter for each individual droplet on the substrate may be between about 0.1 mm and about 1.0 mm. The speed of the jetting, i.e. the speed of each individual droplet, may be between about 5 m/s and about 50 m/s. The speed of the jetting mechanism, e.g. the impacting mechanism for impacting the jetting nozzle, may be as high as between about 5 m/s and about 50 m/s but is typically smaller than the speed of the jetting, e.g. between about 1 m/s and about 30 m/s, and depends on the transfer of momentum through the nozzle.

The term "formation" of a droplet may refer to the break-off of a fluid filament induced by the motion of the fluid element. This may be contrasted to a slower natural break-off akin to dripping where the break-off of a fluid filament is driven for example by gravity or capillary forces.

Without acquiescing to a particular physical model, the volume and/or the shape of the jetted droplet is believed to depend on the actual viscosity at the break-off, such that an increased viscosity may reduce the plasticity or elasticity of the filament and promote an earlier and more well-defined break-off.

Typically, an ejector is software controlled. The software needs instructions for how to apply the viscous medium to a specific substrate or according to a given (or alternatively, desired or predetermined) jetting schedule or jetting process. These instructions are called a "jetting program". Thus, the jetting program supports the process of jetting droplets of viscous medium onto the substrate, which process also may be referred to as "jetting process" or "printing process". The jetting program may be generated by a pre-processing step performed off-line, prior to the jetting process.

As discussed herein, the term "deposit size" refers to the area on the workpiece, such as a substrate, that a deposit will cover. An increase in the droplet volume generally results in an increase in the deposit height as well as the deposit size.

A "workpiece" may be a board (e.g., a printed circuit board (PCB) or flexible PCB), a substrate for ball grid arrays (BGA), a flexible substrate (e.g., paper) chip scale packages (CSP), quad flat packages (QFP), wafers, flip-chips, or the like.

According to an embodiment, the impacting device may comprise a piston that together with an inner sidewall of the jetting chamber defines a gap or slit through which the viscous medium may be supplied to the jetting chamber. The jetting chamber may hence be formed as a cylinder bore in which the piston travels during the impact, wherein the gap is defined by the difference in diameter of the cylinder bore and the piston. In this configuration the shearing of the viscous medium is determined by the relative motion between the inner wall of the jetting chamber and the rotating piston, and by the size of the gap such that the shearing rate may be increased upon increased rotational speed and/or decreased gap size. Preferably, the rotating mechanism may be configured to rotate the impacting device at different predetermined speeds based on a desired shearing of the viscous medium.

According to an embodiment, the sidewall of the piston may comprise a channel or groove for accommodating viscous medium. The channel may e.g. extend in a helical shape along the piston and thus act as a pump feeding the viscous medium towards the jetting nozzle as the piston rotates. Alternatively, or additionally a similar structure may be provided in the sidewall of the chamber, or cylinder bore defining the gap in which the viscous medium is fed. The present embodiment thus allows for the viscous medium to be transported within the ejector by a pumping action caused by the rotation of the piston.

According to an embodiment, the impacting device may comprise an actuating part and an impacting part, wherein the impacting device may be arrangeable in a first state in which the actuating part and the impacting part are separated from each other, and in a second state in which the actuating part engages the impacting part and exerts a force on the impacting part to cause the impacting part to impact and thereby expel the viscous through the nozzle. In said second state, the actuating part and the impacting part of the impacting device may be configured to move together in a first sequence of vertical movements such that shearing is induced in the viscous medium to be jetted without, or without substantially, any viscous medium being expelled through the nozzle, followed by a second separate movement of the actuating part and the impacting part moved together to impact a volume of the viscous medium in the chamber such that viscous medium is jetted through the nozzle towards the substrate.

According to a certain method of the technology disclosed, the piezo is activated to engage the actuating part with the impacting part and move the two parts together downward to define (or create) a desired volume. Thereafter, the chamber is filled with viscous medium. After the chamber has been filled with the desired viscous medium, the piezo is again activated to engage the actuating part with the impacting part to move the two parts together in a sequence of vertical reciprocal movements such that shearing is induced in the viscous medium to be jetted, and without, or without substantially, any viscous medium being expelled through the nozzle. After shearing is induced, the piezo/actuating part rapidly retracts upwards, said rapid retraction is separating the upper actuating part from the lower impacting part as viscous forces slows the movement of the lower impacting part. Finally, the piezo is again extended to exert a downward force to again engage the actuating part with the impacting part to the move two parts together in a downward movement in order to impact a volume of the viscous medium in the chamber such that viscous medium is jetted through the nozzle towards the substrate.

According to a certain method of the technology disclosed, the piezo is activated during a state when the actuating part is engaging with the impacting part in order to define or create a desired volume. Thereafter, the chamber is filled with viscous medium. After the chamber has been filled with viscous medium, the piezo is again activated to engage the actuating part with the impacting part to move together in a sequence of vertical reciprocal movements such that shearing is induced in the viscous medium to be jetted, and without, or without substantially, any viscous medium being expelled through the nozzle. After the sequence of vertical reciprocal movements is performed, the piezo/actuating part rapidly retracts upwards to separate the upper actuating part from the lower impacting part as viscous forces slows the movement of the lower impacting part. Finally, the piezo is again extended to exert a downward force to again engage the actuating part with the impacting part in order to impact a volume of the viscous medium in the chamber such that viscous medium is jetted through the nozzle towards the substrate.

By separating the impacting device into an actuating part and an impacting part, two different lengths of stroke can be achieved. Considering the length of stroke as the total distance the actuating part and the impacting part, respectively, moves during a jetting cycle, the separation in the first state allows for the length of stroke of the actuating part to be greater than the length of stroke of the impacting part. Put differently, when comparing the motion of the actuating part and the impacting part, the actuating part may retract further away from the nozzle.

The length of stroke of the actuating part is a parameter of interest in the jetting process, as it may affect the maximum velocity at which the impacting device impacts the viscous medium to be jetted. Increasing the length of stroke gives the actuating part an increased distance over which it may accelerate during the stroke. The velocity at the impact may, in turn, affect the jetting in terms of e.g. exit speed of the jetted droplet, its shape, spreading on the substrate, breakoff etcetera.

The length of stroke of the impacting part can be considered to correspond to the displacement or stroke volume in the jetting chamber, and should, at least according to some examples, be matched to the volume of the viscous medium to be jetted. A too long stroke, or too large displacement, may lead to air being sucked into the jetting chamber, via the nozzle, as the impacting device is retracted from the nozzle.

This may in particular be the case when the displacement volume is larger than the feeding rate of viscous medium to the chamber. The entrapped air in the jetting chamber may impair the quality of the jetting process and make the process unreliable. A too short length of stroke may, on the other hand, result in a too low volume to be jetted as the displacement is too low to expel the desired amount through the nozzle.

According to a second aspect a system for jetting viscous medium onto a substrate is provided, wherein the system comprises an ejector as described with reference to the first aspect, and a sensor for measuring a shear force acting on the impacting device as it induces shearing in the viscous fluid. The sensor may e.g. be coupled to the rotating mechanism controlling the rotation of the impacting device, and be configured to measure the power or force required for causing the rotation, or the resistance to rotation experienced by the rotating impacting device. A relatively high resistance may indicate a relatively high viscosity, whereas a relatively low resistance may indicate a relatively low viscosity of the viscous medium.

According to an embodiment, the system may further comprise a control unit configured to compare the measured shear force with a target or reference shear force and, based on said comparison, determine a speed of rotation of the impacting device.

By monitoring the shear force acting on the impacting device, and thus at least indirectly the viscosity of the viscous medium in the ejector, the operation of the ejector can be adjusted accordingly. The adjustment may include several different parameters, such as e.g. feeding rate, impact force and rotational speed of the impacting device, depending on the desired result. A relatively high shear force may e.g. be addressed with increased rotational speed so as to induce shear thinning of the viscous medium, whereas a relatively low shear force may imply a too high rotational speed or too low volume of viscous medium present in the ejector. The latter may in such case be addressed by increasing the feeding rate to the jetting chamber.

The monitoring may also be used to compensate for individual variations between different ejectors and/or variations in the rheological characteristics of the medium to be jetted. The ejectors may e.g. vary in terms of mechanical tolerances, friction and supply rate to the chamber, whereas the viscous characteristics of the medium may vary in terms of e.g. overall viscosity, shear thinning properties and thixotropy (i.e., the time dependence of the shear thinning/thickening). The monitored shear force may therefore be used in a closed loop manner to regulate the subsequent operation in terms of e.g. rotational speed, velocity and length of stroke of the impacting device during the jetting process so as to dynamically improve the quality and reliability of the jetting.

Alternatively, or additionally the monitored shear force or viscosity may be used to calibrate or adjust the parameters controlling the operation of the hardware required for jetting to viscous media having different fluid dynamic behaviour and/or to different types of viscous media. In an exemplifying calibration process, the shear force may be monitored during jetting of one or several samples of a certain type of viscous medium (in one or several ejectors). The monitored shear force may then be used for determining a set of (static or dynamic) jetting parameters that can be used for subsequent jetting of that specific type of viscous medium.

Thus, it will be appreciated that the present embodiment may be used not only for a more or less continuous or real time monitoring of the jetting process, but also for calibrating the jetting process to different types of viscous media or ejectors. The monitoring of the jetting may be performed as the ejector is used in production, whereas the calibration e.g. may be performed once for each type of viscous medium of ejector, at predetermined intervals for quality check, or upon initiation by the operator.

According to a third aspect, a method for jetting a viscous medium onto a substrate is provided. The jetting is performed by means of an ejector comprising a jetting chamber adapted to accommodate the viscous medium, a nozzle communicatively connected to the chamber, and an impacting device. The method comprises the steps of providing viscous medium to the jetting chamber, rotating the impacting device around a length axis of the impacting device such that shearing is induced in the viscous medium to be jetted, and causing the impacting device to impact a volume of the viscous medium in the chamber such that viscous medium is jetted through the nozzle towards the substrate.

According to an embodiment, the viscous medium may be supplied to an inlet communicatively connected to or associated with the impacting part of the impacting device. This may be achieved by means of a feeder or feeding mechanism.

According to an embodiment, the viscous medium may be supplied to the jetting chamber through at least one axial channel part of or associated with the impacting part of the impacting device.

According to an embodiment, the volume of the viscous medium supplied through the inlet may correspond to volume of the viscous medium jetted through the nozzle, and may further be determined by a selected feeding rate of the feeding mechanism.

The inventive concept disclosed may be embodied as computer readable instructions for controlling a programmable computer in such manner that is causes an ejector or system to perform the method outlined above. Such instructions may be distributed in the form of a computer-program product comprising a non-volatile computer-readable medium storing the instructions.

It will be appreciated that any of the features in the embodiments described above for the ejectors according to the first inventive concept may be combined with the system and method according to the other aspects of the inventive concept disclosed.

Further objective of, features of, and advantages with the present inventive concept will become apparent when studying the following detailed disclosure, the drawings and the appended claims. Those skilled in the art will realise that different features of the present inventive concept can be combined to create embodiments other than those described in the following.

BRIEF DESCRIPTION OF THE DRAWINGS

The above, as well as additional objects, features and advantages of the present inventive concept, will be better understood through the following illustrative and non-limiting detailed description of preferred embodiments of the present inventive concept, with reference to the appended drawings. In the drawings like reference numerals will be used for like elements unless stated otherwise.

DETAILED DESCRIPTION OF PREFERRED EMBODIMENTS

Detailed embodiments of the present inventive concept will now be described with reference to the drawings. The present inventive concept may, however, be embodied in many different forms and should not be construed as limited to the embodiments set forth herein; rather, these embodiments are provided by way of example so that this disclosure will convey the scope of the inventive concept to those skilled in the art.

Figure 1:
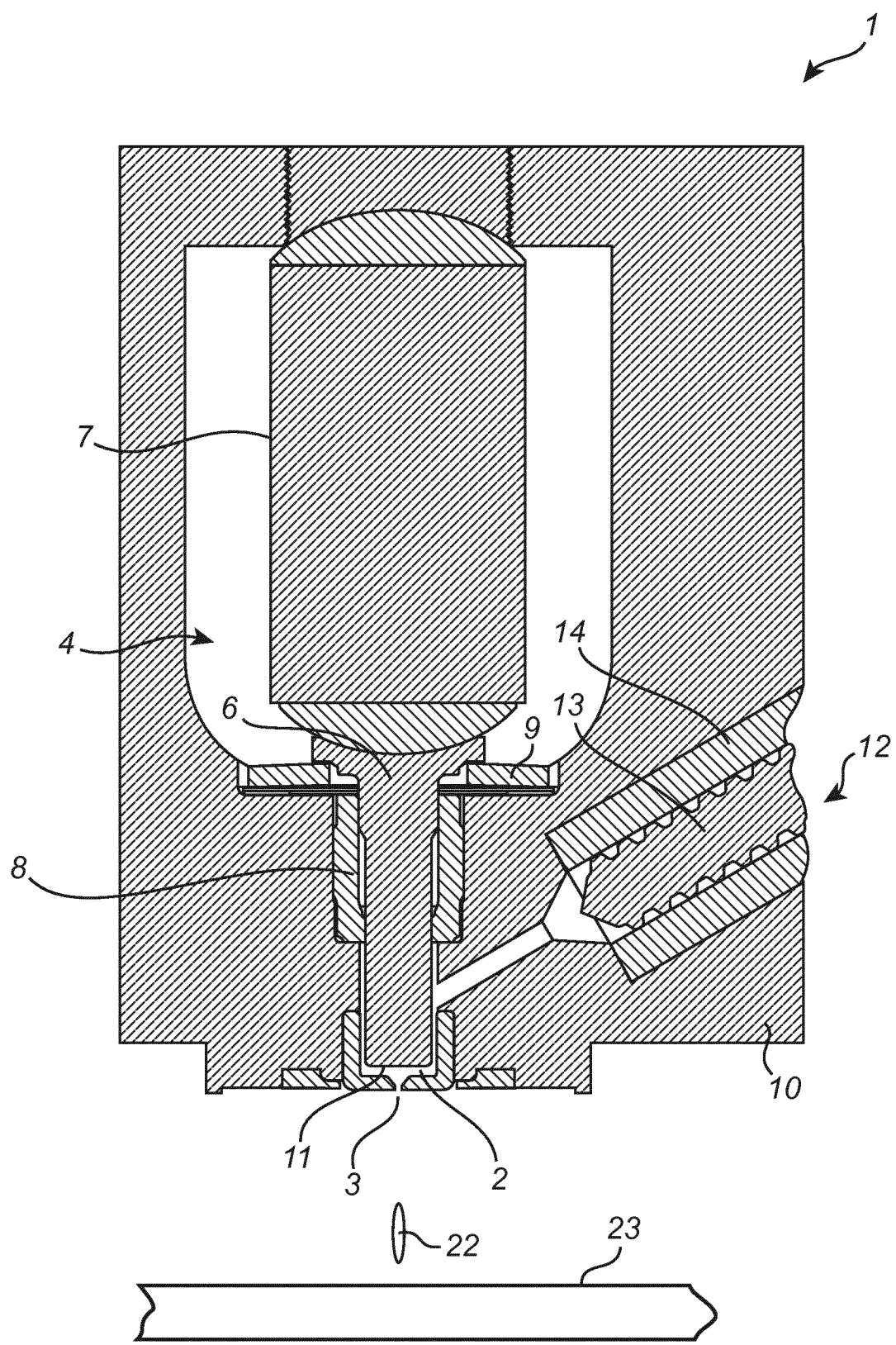
FIG. 1 is a schematic illustration of an ejector.

With reference to FIG. 1, there is shown an ejector 1 comprising an assembly housing 10 and an impacting device 4, which in this implementation may include a piezoelectric actuator 7 and a plunger or piston 6 operatively connected to the piezoelectric actuator 7. The piston 6 may be axially moveable while slideably extending through a cylinder bore hole in a bushing 8. Cup springs 9 may be provided to resiliently balance the plunger 6 against the assembly housing 10, and for providing a preload for the piezoelectric actuator 7. An eject control unit (not shown) may apply a drive voltage intermittently to the piezoelectric actuator 7, thereby causing an intermittent extension thereof, and hence a reciprocating movement of the plunger 6 with respect to the assembly housing 10, in accordance with solder pattern printing data.

Furthermore, the ejector 1 may comprise jetting nozzle 3, which may be operatively directed against a substrate 23 onto which droplets 22 of viscous medium are to be jetted. The nozzle 3 provides an outlet 3 through which the droplets 22 are jetted towards the substrate 23.

A jetting chamber 2 may be defined between an end surface 11 of the plunger 6 and the nozzle 3. Axial movement of the plunger 6 towards the nozzle 3 may cause a rapid decrease in the volume of the chamber 2. Such an impact by the plunger 6 may thus cause a rapid pressurisation and jetting of viscous medium through the nozzle 3.

Viscous medium may be supplied to the jetting chamber 2 from a supply container (not shown in FIG. 1), via a feeding mechanism or feeder 12. The feeder 12 may comprise an electric motor (not shown) having a motor shaft 13 partly provided in a tubular bore that extends through the ejector housing 10 to an outlet port communicating with the chamber 2. At least a portion of the rotatable motor shaft, or feed screw 13 may be surrounded by a tube 14 made of an elastomer or the like arranged coaxially therewith in the tubular bore, wherein the threads of the rotatable feed screw 13 may be in sliding contact with the innermost surface of the tube (14). Viscous medium captured between the threads of the feed screw 13 and the inner surface may then be forced towards the chamber 2 in accordance with the rotational movement of the feed screw 13.

Figure 2:
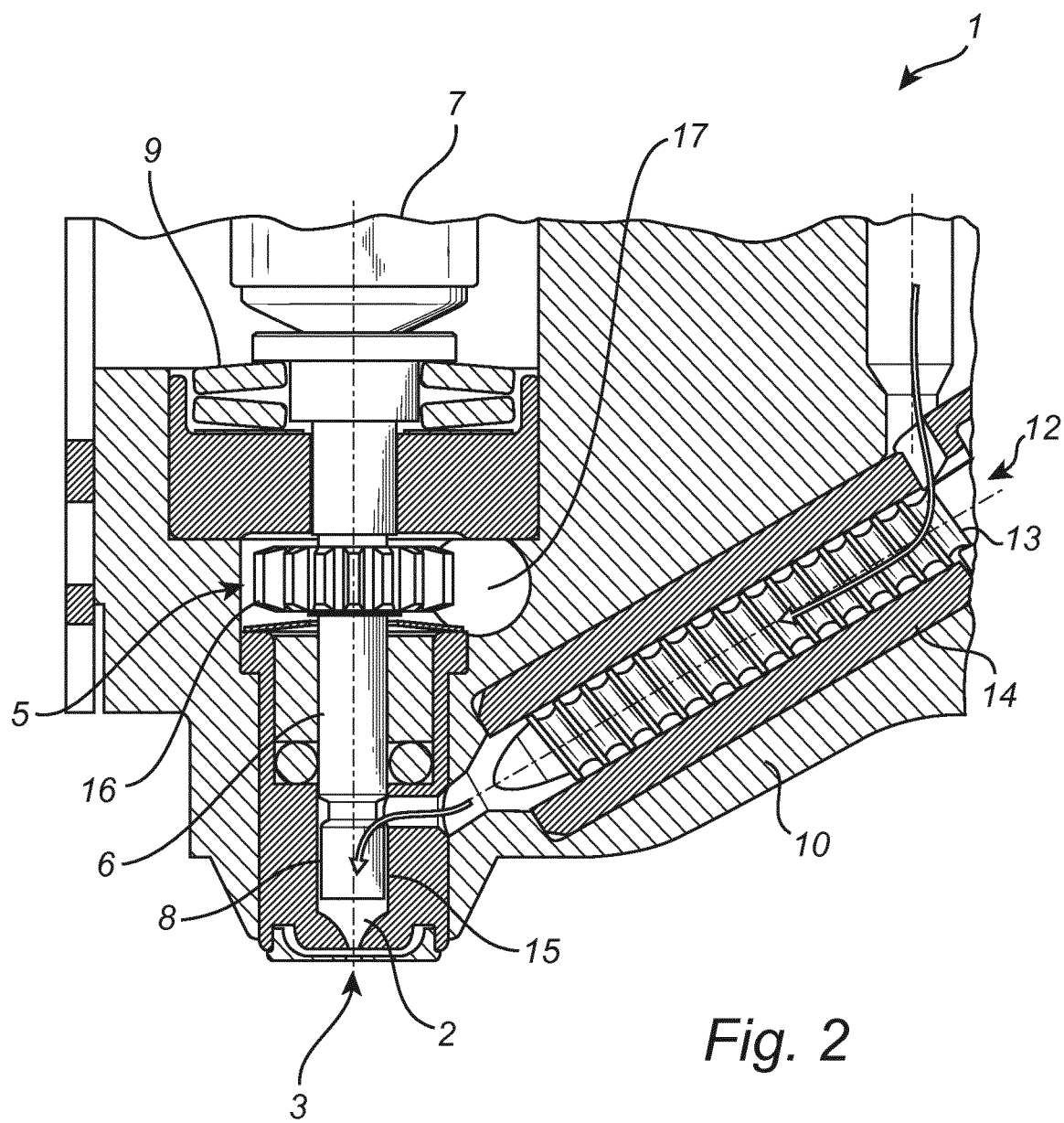
FIGS. 2 and 3 show rotating mechanisms for inducing shearing of the viscous medium in an ejector.

A rotating mechanism of an ejector according to an embodiment of the present inventive concept will now be described. FIG. 2 illustrates a portion of an ejector 1 that may be similarly configured as the ejector described with reference to FIG. 1. In addition, the ejector 1 comprises a rotating mechanism 5 arranged to cause the impacting device 4 to rotate. As indicated in the present figure, the impacting device 4 may be formed of a piston part 6 for ejecting the viscous medium through the nozzle 3, and an actuating part 7 arranged to force the piston part towards the nozzle 3 during a stroke. The rotating mechanism 5 may be arranged to cause the piston 6 to rotate around its length axis, i.e., around an axis coinciding with the direction of motion during the stroke to deform or induce shearing in the viscous medium adjacent to the piston part 6.

In the present example, viscous medium may be supplied by means of a feeder 12 comprising a screw 13 rotating inside a tube 14, thus acting as an auger pump. In FIG. 2, the path of the supplied viscous medium is indicated by arrows. The feeder 12 may supply the viscous medium to an opening or entrance of the bushing 8 accommodating the piston 6. A gap 15 may be defined between the outer surface of the piston 6 and the cylindrical shape of the part of the jetting chamber, or bushing 8, in which the piston 6 moves back and forth during the jetting process. As the piston 6 rotates in the bushing, the viscous medium in the gap 15 may be subject to deformation or shearing. Further, shearing may be induced in the viscous medium present in the part of the jetting chamber 2 arranged between the piston 6 and the nozzle 3.

The rotating mechanism 5 may be realised by means of an engaging part, such as a toothed wheel 16, that is fixedly mounted on the piston 6 and actuated by means of an actuating mechanism, such as a rotating motor 17 having an engaging gear, attached to the housing 10. The engagement between the engaging part 16 and the actuating mechanism 17 may be provided with a clearance allowing for an axial movement between the piston 6 and the housing 10 during the stroke of the piston 6. A control unit (not shown) may be connected to the actuating mechanism 17 for controlling its operation and thus the shearing of the viscous medium in the gap 15 and/or the jetting chamber 2. The control mechanism 17 may also be connected to a processing unit (not shown) for analysing the force or motion resistance acting on the rotating piston 6, thereby determining a shear force acting on the viscous medium.

Figure 3:
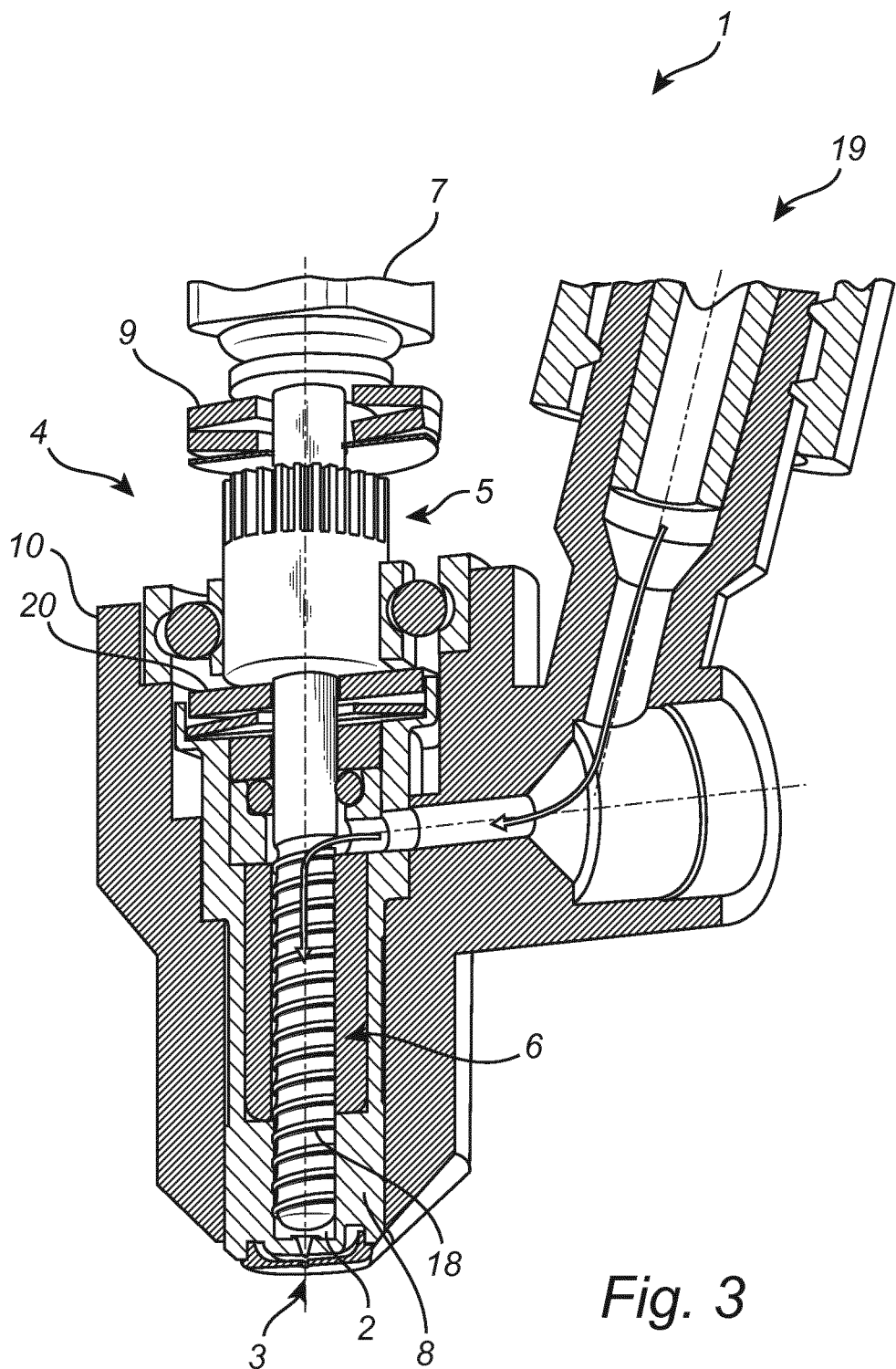

FIG. 3 shows a portion of an ejector similarly configured as the embodiment described with reference to FIG. 2. The present embodiment however differs in that the impacting device 4, and in particular its piston part 6, comprises a channel 18 for accommodating the viscous medium. The channel 18 may be formed as a helical groove 18 arranged on the outer surface of the piston 6 so that viscous medium may be transported towards the jetting chamber 2 and the nozzle 3 as the piston 6 rotates around its length axis. The viscous medium may be supplied to the channel 18 from a supply container 19, and the pump action caused by the rotation of the helical groove 18 in the cylinder 8 may be sufficient for feeding the viscous medium to the jetting chamber without using the feeder 12 disclosed in e.g. FIG. 2.

The actuating part, such as the piezoelectric actuator 7, and the impacting part, such as the piston 6, may be axially separable from each other. This allows for the impacting device 4 to be arranged in a first state in which the piezoelectric actuator 7 and the piston 6 are separated from each other, and in a second state in which the piezoelectric actuator 7 and the engages the piston 6 to exert a force on the piston 6 to impact the viscous medium in the jetting chamber 2.

Figure 4:
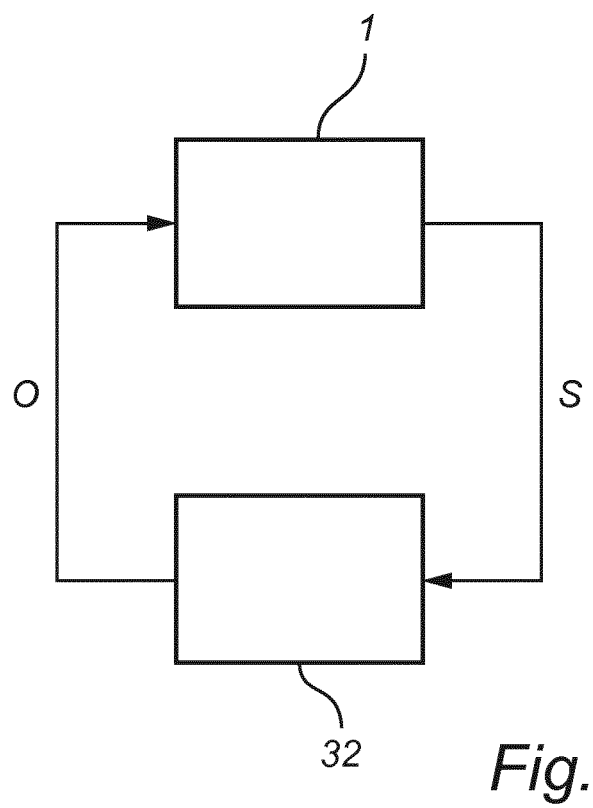
FIG. 4 is a schematic illustration of a system for jetting viscous medium onto a substrate.

FIG. 4 is a schematic representation of a system according to an embodiment of the present inventive concept. The system may comprise an ejector 1 according to any of the above described embodiments, and a control unit 32. The ejector 1 may comprise a sensing mechanism (not shown) that is configured to output a sensor signal S indicative of a directly or indirectly measured viscosity of the viscous medium in the ejector 1. The viscosity may e.g. be determined by measuring a shear force acting on the rotating impacting device. The sensor signal S may be transmitted to the control unit 32, wherein it may be processed and the measured quantity, such as e.g. a current required by the rotating mechanism for rotating the impacting device, compared to a reference value or translated to an estimated shearing force or viscosity. The reference value may e.g. be provided in the form of a list entry or a post in a look-up table. Based on the comparison between the measured quantity and the reference value, a correction factor may be calculated and used for adjusting e.g. the rotation or impact force of the impacting device. The operation parameters may be output from the control unit 32 in the form of a control signal O and transmitted to the ejector 1. Thus, the monitored rotation of the impacting device may be used in a closed-loop manner for adjusting the operation of the ejector 1.

Figure 5:
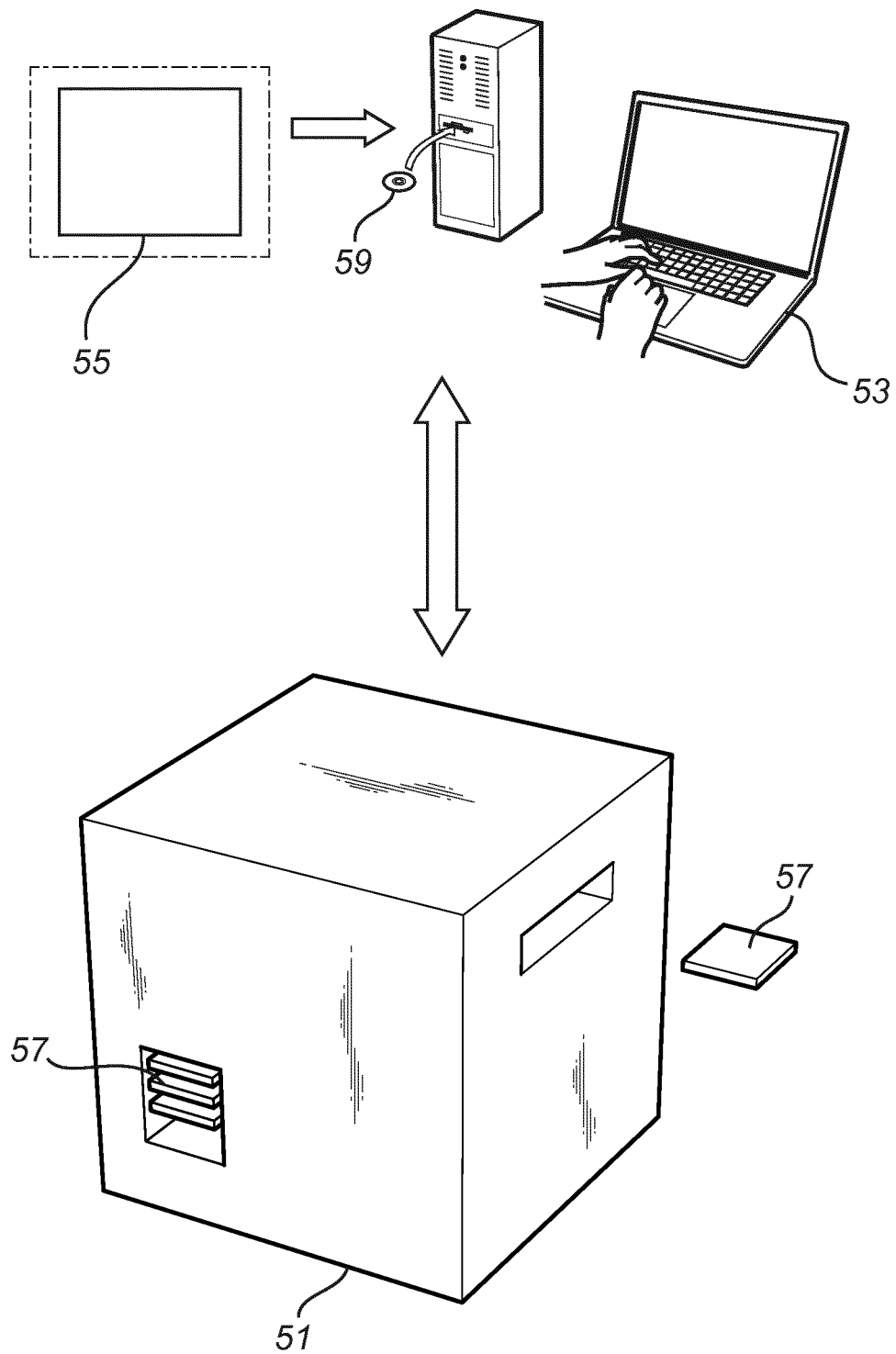
FIG. 5 shows a system for jetting viscous medium onto a substrate.

With reference to FIG. 5, there is illustrated a jetting machine 51 in which substrates 57 will be provided with droplets of viscous medium, such as e.g. adhesive or solder paste. A software program may be run on a computer 53, which communicates with the machine 51. The software program has a database, which holds principal manufacturing data about substrates, e.g., PCBs, machine data for the machine in which the substrates are to be processed. Substrate data 55 about the substrate may be imported to the database, preferably in the form of CAD data comprised in a CAD file. The program may be adapted for generating a jetting program controlling the jetting process. The jetting program may e.g. comprise parameters affecting the impacting force of the impacting device, the supply of viscous medium to the jetting chamber, and a rotational speed of the impacting device so as to provide a desired viscosity. The software program may be provided on a computer readable medium which is illustrated by a CD ROM 59 in FIG. 5.

Figure 6:
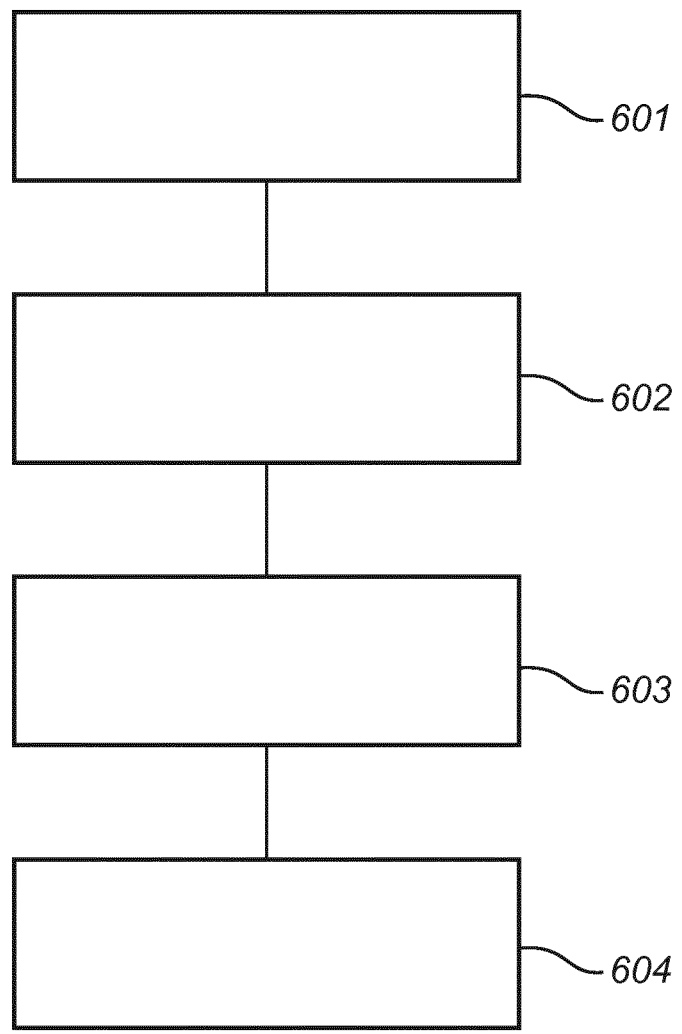
FIG. 6 is a flow chart illustrating a method for jetting viscous medium onto a substrate.

FIG. 6 is a flowchart illustrating an example of a method for jetting viscous medium onto a substrate by means of an ejector or system according to any of the above embodiments. In a first step, viscous medium is provided 601 to the jetting chamber 2. This may e.g. be realised by means of a feeder 12 connected to a supply container 19. Preferably, the viscous medium may be fed through an opening in the housing 10 and enter the gap 15 defined by the outer sidewall of the piston part 6 of the impacting device and the cylinder bore 8 of the housing 10. In a next step, the impacting device 4 is rotated 602 around its length axis such that shearing is induced in the viscous medium to be jetted. The shearing may e.g. be induced in the viscous medium present in the gap 15. In case the viscous medium is shear thinning for such shearing rates, this may result in a reduced viscosity that facilitates the transporting of the viscous medium towards the nozzle 3. In a further step, the impacting device 4 may be caused to impact 603 a volume of the viscous medium in the chamber 2 such that viscous medium 22 is jetted through the nozzle 3 towards the substrate 23. The impacting 603 may be realised by means of an actuating part, such as a piezoelectric actuator 7, impacting on the piston part 6 to force the piston part 6 to slide along its axial direction towards the nozzle 3, thereby causing the viscous medium 22 to be expelled from the jetting chamber 2. In a further step, a quantity indicative of a shear force acting on the impacting device 4 as it induces shearing in the viscous medium may be monitored 604. The monitoring may e.g. be performed by means of a control unit and/or processor configured to e.g. determine a viscosity of the viscous medium.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. An ejector for jetting a viscous medium onto a substrate, the ejector comprising:
   a jetting chamber configured to accommodate the viscous medium;
   a nozzle communicatively connected to the jetting chamber; and
   an impacting device configured to impact a volume of the viscous medium in the jetting chamber such that viscous medium is jetted through the nozzle towards the substrate;
   wherein the impacting device is further configured to perform at least one of moving in a sequence of vertical movements and rotationally moving, such that shearing is induced in the viscous medium to be jetted without, or without substantially, any viscous medium being expelled through the nozzle, wherein the moving in the sequence of vertical reciprocal movements and/or the rotationally moving is adjustable to compensate for variations in viscous characteristics between different, types of viscous media, the viscous characteristics including at least one of overall viscosity, shear thinning properties, or thixotropy.

2. The ejector according to claim 1, wherein the impacting device comprises a piston configured to move up and down in a sequence of vertical reciprocal movements to induce shearing in the viscous medium to be jetted.

3. The ejector according to claim 2, wherein the ejector is configured to supply viscous medium to the jetting chamber via a gap between a sidewall of the piston and an inner sidewall of the jetting chamber.

4. The ejector according to claim 3, wherein the sidewall of the piston has a channel configured to accommodate the viscous medium.

5. The ejector according to claim 4, wherein said channel is a helical groove configured to pump viscous medium towards the jetting chamber.

6. The ejector according to claim 1, the ejector further comprising a rotating mechanism configured to rotate the impacting device around a length axis of the impacting device to induce shearing in the viscous medium to be jetted.

7. The ejector according to claim 6, wherein the rotating mechanism is configured to rotate the impacting device at different speeds, said different speeds being based on a desired shearing of the viscous medium.

8. The ejector according to claim 1, wherein the impacting device comprises an actuating part and an impacting part, and wherein the impacting device is arrangeable in a first state in which the actuating part and the impacting part are separated from each other, and in a second state in which the actuating part engages the impacting part and exerts a force on the impacting part, thereby causing the impacting part to impact said volume of the viscous medium in the jetting chamber.

9. The ejector according to claim 8, the ejector further comprising a rotating mechanism configured to rotate the actuating part around a length axis of the impacting device to induce shearing in the viscous medium to be jetted.

10. The ejector according to claim 1, wherein said ejector is configured so that said sequence of vertical movements, or rotation, for inducing shearing in the viscous medium is a first separate movement, or rotation, at a speed at which no, or substantially no, viscous medium is being expelled through the nozzle, and wherein said first separate movement, or rotation, is performed prior to a second separate movement of the impacting device, for impacting the volume of the viscous medium in the jetting chamber such that viscous medium is jetted through the nozzle towards the substrate.

11. The ejector according to claim 1, wherein the different types of viscous media include at least one shear thickening viscous medium and at least one shear thinning viscous medium.

12. A system for jetting a viscous medium onto a substrate, said system comprising:
   an ejector, the ejector including
      a jetting chamber configured to accommodate the viscous medium,
      a nozzle communicatively connected to the jetting chamber, and
      an impacting device configured to impact a volume of the viscous medium in the jetting, chamber such that viscous medium is jetted through the nozzle towards the substrate, wherein the impacting device is farther configured to perform at least one of moving in a sequence of vertical movements or rotationally moving, such that shearing is induced in the viscous medium to be jetted without, or without substantially, any viscous medium being expelled through the nozzle; and
   a sensor configured to measure a shear force acting on the impacting device as the impacting device induces the shearing in the viscous medium.

13. The system according to claim 12, further comprising:
   a control unit configured to compare the measured shear force with a target shear force and, based on the comparing, determine a speed of at least one of the sequence of vertical movements and rotation of the impacting device.

14. A method for jetting a viscous medium onto a substrate using an ejector, said ejector including a jetting chamber adapted to accommodate the viscous medium, a nozzle communicatively connected to the jetting chamber, and an impacting device, the method comprising:
   providing the viscous medium to the jetting chamber;
   moving, by at least one of vertically moving and rotationally moving, the impacting device such that shearing is induced in the viscous medium to be jetted, wherein the moving in the sequence of vertical reciprocal movements and/or the rotationally moving is adjustable to compensate for variations in viscous characteristics between different types of viscous media, the viscous characteristics including at least one of overall viscosity, shear thinning properties, or thixotropy; and
   causing the impacting device to impact a volume of the viscous medium in the jetting chamber such that viscous medium is jetted through the nozzle towards the substrate.

15. The method according to claim 14, wherein said moving of the impacting device to induce shearing in the viscous medium to be jetted is performed by rotating at least one part of the impacting device around a length axis of the impacting device.

16. The method according to claim 15, wherein
   the impacting device includes an actuating part and an impacting part, and
   the method includes rotating the impacting part around the length axis of the impacting device.

17. The method according to claim 16, wherein the volume of the viscous medium in the jetting chamber is supplied to an inlet communicatively connected to or associated with the impacting part of the impacting device.

18. The method according to claim 17, wherein the volume of the viscous medium supplied to the inlet corresponds to the viscous medium jetted through the nozzle and is further determined by a selected feeding rate of a feeding mechanism.

19. The method according to claim 16, wherein the viscous medium is supplied to the jetting chamber through at least one axial channel part of or associated with the impacting part of the impacting device.

20. The method according to claim 16, wherein the method comprises performing at least one of moving said impacting device in a sequence of vertical movements and rotationally moving said impacting device to induce shearing in the viscous medium in a first separate movement at a speed at which no, or substantially no, viscous medium is being expelled through the nozzle, and wherein said first separate movement is followed by a second separate movement of the impacting device, or the impacting part, to impact the volume of the viscous medium in the jetting chamber such that viscous medium is jetted through the nozzle towards the substrate.

* * * * *